(12) United States Patent
Reithmaier et al.

(10) Patent No.: US 7,494,836 B2
(45) Date of Patent: Feb. 24, 2009

(54) SEMICONDUCTOR LASER WITH A WEAKLY COUPLED GRATING

(75) Inventors: Johann Peter Reithmaier, Würzburg (DE); Lars Bach, Rimpar (DE)

(73) Assignee: Nanoplus GmbH, Gerbrunn (DE)

( * ) Notice: Subject to any disclaimer, the term of this patent is extended or adjusted under 35 U.S.C. 154(b) by 0 days.

(21) Appl. No.: 11/393,611

(22) Filed: Mar. 30, 2006

(65) Prior Publication Data

US 2006/0172446 A1    Aug. 3, 2006

Related U.S. Application Data

(62) Division of application No. 10/212,463, filed on Aug. 5, 2002, now Pat. No. 7,061,962.

(30) Foreign Application Priority Data

Aug. 6, 2001   (EP) .................................. 0118970

(51) Int. Cl.
    *H01L 21/00* (2006.01)
(52) U.S. Cl. ........................... 438/31; 438/32
(58) Field of Classification Search ............. 438/22, 438/31, 32
    See application file for complete search history.

(56) References Cited

U.S. PATENT DOCUMENTS

| | | | | |
|---|---|---|---|---|
| 4,805,184 A | * | 2/1989 | Fiddyment et al. | 372/96 |
| 5,329,542 A | * | 7/1994 | Westbrook | 372/96 |
| 5,457,709 A | | 10/1995 | Capasso et al. | 372/45 |
| 5,509,025 A | | 4/1996 | Capasso et al. | 372/45 |
| 5,614,436 A | * | 3/1997 | Shim et al. | 438/32 |
| 5,727,015 A | | 3/1998 | Takahashi et al. | 372/96 |
| 5,936,989 A | | 8/1999 | Capasso et al. | 372/45 |
| 5,978,397 A | | 11/1999 | Capasso et al. | 372/45 |
| 5,982,804 A | * | 11/1999 | Chen et al. | 372/96 |
| 6,137,817 A | | 10/2000 | Baillargeon et al. | 372/45 |
| 6,291,256 B1 | * | 9/2001 | Chen et al. | 438/32 |

(Continued)

FOREIGN PATENT DOCUMENTS

EP    0 877 454    11/1998

(Continued)

OTHER PUBLICATIONS

Aellen et al, "Continuous-Wave Distributed-Feedback Quantum-Cascade Lasers on a Peltier Cooler", *Applied Physics Letters*, (© 2003 American Institute of Physics) vol. 83, No. 10, Sep. 8, 2003, pp. 1929-1931.

(Continued)

*Primary Examiner*—Savitri Mulpuri
(74) *Attorney, Agent, or Firm*—Michaelson & Associates; Peter L. Michaelson; George Wolken, Jr.

(57) ABSTRACT

A semiconductor laser with a semiconductor substrate, a laser layer arranged on the semiconductor substrate, a waveguide arranged parallel to the laser layer and a strip shaped grating structure is disclosed. The laser layer, the waveguide and the grating are arranged a configuration which results in weak coupling between the laser light and the grating structure, so that the laser light interacts with an increased number of grating elements. A process for the production of such a semiconductor laser is also disclosed.

4 Claims, 6 Drawing Sheets

U.S. PATENT DOCUMENTS

| | | | |
|---|---|---|---|
| 6,399,404 B2* | 6/2002 | Sakata | 438/22 |
| 6,400,744 B1 | 6/2002 | Capasso et al. | 372/96 |
| 6,560,259 B1 | 5/2003 | Hwang | 372/45 |
| 6,573,116 B2* | 6/2003 | Watanabe et al. | 438/32 |
| 6,665,325 B2 | 12/2003 | Beck et al. | 372/46 |
| 6,671,306 B1* | 12/2003 | Forchel et al. | 372/96 |
| 6,912,237 B2* | 6/2005 | Ohkubo et al. | 372/45.01 |
| 7,177,335 B2* | 2/2007 | Kamp et al. | 372/46.01 |
| 2002/0028390 A1* | 3/2002 | Mazed | 430/5 |
| 2003/0040134 A1* | 2/2003 | Deliwala | 438/22 |
| 2004/0013145 A1 | 1/2004 | Faist et al. | 372/45 |

FOREIGN PATENT DOCUMENTS

| | | |
|---|---|---|
| EP | 1 133 035 | 9/2001 |

OTHER PUBLICATIONS

Anders et al, "Room-Temperature Emission of GaAs/AlGaAs Superlattice Quantum-Cascade Lasers at 12.6 µm", *Applied Physics Letters*, (© 2002 American Institute of Physics) vol. 80, No. 11, Mar. 18, 2002, pp. 1864-1866.

Anders et al, "Room Temperature Lasing of Electrically Pumped Quantum Cascade Micro-cylinders", *Physica E* (2003), (© 2002 Elsevier Science B.V.) vol. 17, pp. 626-628.

Beck et al, "Continuous Wave Operation of Quantum Cascade Lasers", *Journal of Crystal Growth 251* (2003) (© 2002 Elsevier Science B.V.) pp. 697-700.

Capasso et al, "Quantum Cascade Lasers: Ultrahigh-Speed Operation, Optical Wireless Communication, Narrow Linewidth, and Far-Infrared Emission", *IEEE Journal of Quantum Electronics* (© 2002 IEEE) vol. 38, No. 6, Jun. 2002, pp. 511-532.

Coldren et al, "Continuously-Tunable Single-Frequency Semiconductor Lasers", *IEEE Journal of Quantum Electronics* (© 1987 IEEE) vol. QE-23, No. 6, Jun. 1987, pp. 903-908.

Colombelli et al, "Quantum Cascade Surface-Emitting Photonic Crystal Laser", *Science*, vol. 302, Nov. 21, 2003, pp. 1374-1377.

Delorme, "Widely Tunable 1.55-µm Lasers for Wavelength-Division-Multiplexed Optical Fiber Communications", *IEEE Journal of Quantum Electronics* (© 1998 IEEE) vol. 34, No. 9, Sep. 1998, pp. 1706-1716.

Faist et al, "Bound-to-Continuum and Two-Phonon Resonance Quantum-Cascade Lasers for High Duty Cycle, High-Temperature Operation", *IEEE Journal of Quantum Electronics* (© 2002 IEEE) vol. 38, No. 6, Jun. 2002, pp. 533-546.

Faist et al, "Distributed Feedback Quantum Cascade Lasers" *Applied Physics Letters* (© 1997 American Institute of Physics) vol. 70, No. 20, May 19, 1997, pp. 2670-2672.

Faist et al, "Quantum Cascade Laser" Science, vol. 264, Apr. 22, 1994, pp. 553-556.

Gauggel et al, "Wide-Range Tunability of GaInP-AlGaInP DFB Lasers with Superstructure Gratings", *IEEE Photonics Technology Letters* (© 1997 IEEE) vol. 9, No. 1, Jan. 1997, pp. 14-16.

Gmachl et al, "Quantum Cascade Lasers with a Heterogeneous Cascade: Two-Wavelength Operations" *Applied Physics Letters* (© 2001 American Institute of Physics) vol. 79, No. 5, Jul. 30, 2001, pp. 572-574.

Gmachl et al, "Single-Mode, Tunable Distributed-Feedback and Multiple-Wavelength Quantum Cascade Lasers" *IEEE Journal of Quantum Electronics* (© 2002 IEEE) vol. 38, No. 6, Jun. 2002, pp. 569-581.

Gmachl et al, "Temperature Dependence and Single-Mode Tuning Behavior of Second-Harmonic Generation in Quantum Cascade Lasers", *Applied Physics Letters* (© 2004 American Institute of Physics) vol. 84, No. 15, Apr. 12, 2004, pp. 2751-2753.

Hofling et al, "Edge-Emitting GaInAs-AlGaAs Microlasers" *IEEE Photonics Technology Letters* (© 1999 IEEE) vol. 11, No. 8, Aug. 1999, pp. 943-945.

Hofling et al, "GaAs/AlGaAs Quantum Cascade Micro Lasers Based on Monolithic Semiconductor-Air Bragg Mirrors" *Electronics Letters*, vol. 40, No. 2, Jan. 22, 2004.

Hofstteter et al, "High-Temperature Operation of Distributed Feedback Quantum-Cascade Lasers at 5.3 µm" *Applied Physics Letters* (© 2001 American Institute of Physics) vol. 78, No. 4, Jan. 22, 2001, pp. 396-398.

Hong et al, "Cascaded Strongly Gain-Coupled (SGC) DFB Lasers with 15-nm Continuous-Wavelength Tuning", *IEEE Photonics Technology Letters* (© 1999 IEEE) vol. 11, No. 10, Oct. 1999, pp. 1214-1216.

Hvozdara et al, "Quantum Cascade Lasers with monolithic Air-Semiconductor Bragg Reflectors", *Applied Physics Letters* (© 2000 American Institute of Physics) vol. 77, No. 9, Aug. 28, 2000, pp. 1241-1243.

Ishii et al, "Quasicontinuous Wavelength Tuning in Super-Structure-Grating (SSG) DBR Lasers" *IEEE Journal of Quantum Electronics* (© 1996 IEEE) vol. 32, No. 3, Mar. 1996, pp. 433-441.

Jayaraman et al, "Theory, Design, and Performance of Extended Tuning Range Semiconductor Lasers with Sampled Gratings" *IEEE Journal of Quantum Electronics* (© 1993 IEEE) vol. 29, No. 6, Jun. 1993, pp. 1824-1834.

Kazarinov et al, "Possibility of the Amplification of Electromagnetic Waves in a Semiconductor with a Superlattice", *Soviet Physics—Semiconductors*, vol. 5, No. 4, Oct. 1971, pp. 707-709.

Kohler et al, "Single-Mode Tunable, Pulsed, and Continuous Wave Quantum-Cascade Distributed Feedback Lasers at $\lambda \cong 4.6$-4.7 µm", *Applied Physics Letters* (© 2000 American Institute of Physics) vol. 76, No. 9, Feb. 28, 2000, pp. 1092-1094.

Kohler, "Single-Mode Tunable Quantum Cascade Lasers in the Spectral Range of the $CO_2$ Laser at 80 = 9.5-10.5 µm", *IEEE Photonics Technology Letters* (© 2000 IEEE) vol. 12, No. 5, May 2000, pp. 474-476.

Kuznetsov, "Theory of Wavelength Tuning in Two-Segment Distributed Feedback Lasers" *IEEE Journal of Quantum Electronics* (© 1988 IEEE) vol. 24, No. 9, Sep. 1988, pp. 1837-1844.

Mason et al, "Ridge Waveguide Sampled Grating DBR Lasers with 22-nm Quasi-Continuous Tuning Range", *IEEE Photonics Technology Letters* (© 1998 IEEE) vol. 10, No. 9, Sep. 1998, pp. 1211-1213.

Muller et al, "Electrically Tunable, Room-Temperature Quantum-Cascade Lasers", *Applied Physics Letters* (© 1999 American Institute of Physics) vol. 75, No. 11, Sep. 13, 1999, pp. 1509-1511.

Muller et al, "Wide-Range-Tunable Laterally Coupled Distributed Feedback Lasers Based on InGaAsP-InP", *Applied Physics Letters* (© 2001 American Institute of Physics) vol. 79, No. 17, Oct. 22, 2001, pp. 2684-2686.

Page et al, "300 K Operation of a GaAs-Based Quantum-Cascade Laser at $\lambda \approx 9$ µm", *Applied Physics Letters* (© 2001 American Institute of Physics) vol. 78, No. 22, May 28, 2001, pp. 3529-3531.

Page et al, "Highly Reflectivity Metallic Mirror Coatings for Mid-Infrared ($\lambda \approx$ µm) Unipolar Semiconductor Lasers", *Semiconductor Science and Technology* (© 2002 IOP Publishing Ltd) vol. 17, pp. 1312-1316.

Page et al, "Optimised Device Processing for Continuous-Wave Operation in GaAs-Based Quantum Cascade Lasers", *Electronics Letters*, vol. 39, No. 14, Jul. 10, 2003.

Pflugl et al, "High-Temperature Performance of GaAs-Based Bound-to-Continuum Quantum-Cascade Lasers", *Applied Physics Letters* (© 2003 American Institute of Physics) vol. 83, No. 23, Dec. 8, 2003, pp. 4698-4700.

Rochat et al, "Long-Wavelength ($\lambda \approx 16$ µm), Room-Temperature, Single-Frequency Quantum-Cascade Lasers Based on a Bound-to-Continuum Transition" *Applied Physics Letters* (© 2001 American Institute of Physics) vol. 79, No. 26, Dec. 24, 2001, pp. 4271-4273.

Schrenk et al, "Continuous-Wave Operation of Distributed Feedback AlAs/GaAs Superlattice Quantum-Cascade Lasers" *Applied Physics Letters* (© 2000 American Institute of Physics) vol. 77, No. 21, Nov. 20, 2000, pp. 3328-3330.

Schrenk et al, "GaAs/AlGaAs Distributed Feedback Quantum Cascade Lasers", *Applied Physics Letters* (© 2000 American Institute of Physics) vol. 76, No. 3, Jan. 17, 2000, pp. 253-255.

Schrenk et al, "High Performance Single Mode GaAs Quantum Cascade Lasers", Physica E (© 2002 Elsevier Science B.V.) vol. 12, pp. 840-843.

Sirtori et al, "GaAs/Al$_x$Ga$_{1-x}$As Quantum Cascade Lasers", *Applied Physics Letters* (© 1998 American Institute of Physics) vol. 73, No. 24, Dec. 14, 1998, pp. 3486-3488.

Sirtori et al, "GaAs-AlGaAs Quantum Cascade Lasers: Physics, Technology, and Prospects", *IEEE Journal of Quantum Electronics* (© 2002 IEEE) vol. 38, No. 6, Jun. 2002, pp. 547-558.

Sirtori et al, "Low-Loss Al-Free Waveguides for Unipolar Semiconductor Lasers", *Applied Physics Letters* (© 1999 American Institute of Physics) vol. 75, No. 25, Dec. 20, 1999, pp. 3911-3913.

Strasser et al, "Intersubband and Interminiband GaAs/AlGaAs Quantum Cascade Lasers", *Physica E* (© 2000 Elsevier Science B.V.) vol. 7, pp. 1-7.

Straub et al, "Simultaneously at Two Wavelengths (5.0 and 7.5 μm) Singlemode and Tunable Quantum Cascade Distributed Feedback Lasers", *Electronics Letters*, vol. 38, No. 12, Jun. 6, 2002, pp. 565-567.

* cited by examiner

SEMICONDUCTOR LASER WITH A WEAKLY COUPLED GRATING

This application is a divisional of patent application Ser. No. 10/212,463 filed Aug. 5, 2002 and entitled "SEMICONDUCTOR LASER WITH A WEAKLY COUPLED GRATING" now U.S. Pat. No. 7,061,962.

BACKGROUND OF THE INVENTION

1. Field of Invention

The present invention relates to a semiconductor laser for the creation of light, including a semiconductor substrate, a laser layer arranged on the semiconductor substrate, a waveguiding layer arranged at least partially close-by the laser layer and a strip-shaped lattice structure. Furthermore the invention relates to a process for the fabrication of such a semiconductor laser.

2. Description of Prior Art

During the past years, laser diodes have been used in an increasing number of applications in different areas of technology. A major field of use is telecommunication technology, where such laser diodes are employed to transmit telephone calls and data. The light emitted from the laser diodes is transmitted via optical fibers to a receiver. Using optical transmission over fibers results in high transmission quality and a very high potential data transmission rate. While originally only one wavelength was used for fiber transmission, (that is, only the light of one laser diode with a single wavelength was transmitted), it has become more common in the last years to use multiple wavelengths for simultaneous transmission over optical fibers, so that many wavelengths contribute simultaneously to the transmission (wavelength multiplexing). With the simultaneous use of multiple wavelengths it is obviously possible to transmit higher data rates over a single optical fiber.

At the present state of technology, transmission using several wavelengths is usually achieved by merging the light emitted by several laser diodes with appropriate devices and then transmitting this light over a span of optical fiber. The single lasers emit light at different wavelengths. In order to achieve a high quality of data transmission and high data throughput it is necessary that the single laser diodes emit only light at the desired target wavelength. In practice, it cannot be avoided that a certain fraction of the light generated by the laser is also emitted at other wavelengths. The most important parameters with respect to the quality of the laser diodes include the so-called mono mode stability and side mode suppression ratio. The mono mode stability describes the deviation of the wavelength of emitted light under different operating conditions (temperature, applied voltage etc.). The side mode suppression ratio specifies the proportion of the light intensity at the strongest emitted wavelength in relation to the second strongest emitted wavelength. The larger the side mode suppression ratio, the less light is emitted in undesired frequency ranges. Other important factors include the change of the laser wavelength over the time of use.

Known laser diodes typically comprise active gain layers in which the light wave is amplified by stimulated emission. Especially in semiconductor lasers, this amplification is not strongly frequency selective, so that light is typically emitted over a broad frequency range. Therefore additional steps are necessary in order to achieve selectivity in frequency, that is to achieve light emission substantially at only one given wavelength. This wavelength or frequency is usually obtained by the use of periodic grating structures. The interference effects between the periodic grating structure and the lightwave causes wavelengths differing from the target wavelength to be strongly suppressed so that the emission is mainly amplified and emitted at the target wavelength.

At the present time it is generally assumed in the field that an exceedingly effective selection of the laser wavelength, and therefore a high side mode suppression, can only be achieved by using a very strong coupling between the lightwave and the periodic grating structure. This assumption is supported by a number of theoretical models and also experimental studies. The strength of the coupling is described by the so-called coupling coefficient k which is usually chosen in the range between $\kappa=100\ cm^{-1}$ and $\kappa=300\ cm^{-1}$ or higher. For example, in the theoretical paper "Mode Selectivity of Distributed Bragg-Reflector Laser with Optical Loss in Corrugated Waveguide" by Masahiro Okuda et al., published in the Japan Journal of Applied Physics, Volume 14, 1975, No. 11, page 1859, an increased coupling coefficient resulted in an increased side mode suppression. The experimental work in the field is also based on the validity of this assumption. For example, in the article "Single and Tunable Dual-Wavelength Operation of an InGaAs-GaAs Ridge Waveguide Distributed Bragg Reflector Laser" by Roh et al. in IEEE Transactions on Photonic Letter, Volume 12, No. 1, January 2000, page 16, the high side mode suppression ratio of the described laser diode is attributed to the relatively high value of the coupling coefficient $\kappa$.

Therefore, a need exists in the art for a semiconductor laser having improved performance in comparison with conventional semiconductor lasers including improved side mode suppression, single mode stability and cost-effective to fabricate and to operate.

SUMMARY OF THE INVENTION

One objective of the present invention is to describe a semiconductor laser which, in comparison to conventional semiconductor lasers, shows improved device performance, especially with an improved side mode suppression ratio and single mode stability while, at the same time, being cost-effective in fabrication and operation. A further objective of this invention is to present a very beneficial and cost-effective method for the fabrication of such a semiconductor laser. Semiconductor lasers having features described herein substantially meet these and other objectives.

These and other objectives are accomplished by the semiconductor laser according to some embodiments of the present invention where the laser layers, the waveguiding area and the grating structure are arranged in such a way that only a weak coupling between the lightwave and the grating structure is present. This in turn leads to the use of a larger number of grating elements which interact with the lightwave. In contrast with the conventional, relatively strong coupling between the lightwave and the grating structure, the design of the laser presented herein clearly results in weaker coupling between the lightwave and the grating structure. By reason of this weak coupling, the interference effects of the lightwave are caused by a larger number of grating structure elements in comparison to conventional distributed Bragg reflector (DBR) laser diodes, which leads to a higher side mode suppression ratio.

Furthermore the lasers described herein show an improved mono mode stability, a higher output power, a lower threshold current and an improved lifetime. Further improved device characteristics can be achieved. However, even if there is no improvement in a particular parameter, the performance of the devices described herein is typically comparable to that of conventional semiconductor lasers but with improvements in fabrication and/or operation cost-effectiveness to be expected.

The exact value of the coupling coefficient between the lightwave and the grating structure according to some embodiments of this invention is adjustable in a wide range and can be tuned to fit the requirements of a particular application. It is shown in connection with some embodiments of the present invention that it is beneficial if the coupling coefficient κ is less than or equal to about 30 cm$^{-1}$, preferably less than or equal to about 10 cm$^{-1}$. The coupling coefficient herein is usually about one order of magnitude smaller than in conventional DBR semiconductor lasers. In every case the coupling coefficient can be chosen by an appropriate design of the semiconductor laser to match the needs of a given application. Arbitrary shapes can be chosen for the grating elements of the grating structures, in particular well-known line shaped grating elements can be used. In the latter case the elements of the lattice structure of the grating are referred to as lattice lines or grating lines.

It is especially beneficial pursuant to some embodiments of the present invention when the laser waveguide has at least one gain region (or gain section) for the amplification of the lightwave which is located at a distance from the lattice structure and has at least one section with a lattice structure where the interaction of the lightwave and the grating structure takes place. By such a separation of the gain region and the interaction region (or grating section) a further improvement of the device properties can be achieved. The semiconductor laser described herein differs from a device known in the art as Distributed-Feedback-Laser (DFB-Laser) which has an interaction region which comes together with the gain region. In fact, there are similarities with devices known in the art as Distributed-Bragg-Reflector-Lasers (DBR-Lasers). By the separation of gain region (or gain section) and interaction region (or grating section) as in some embodiments of the present invention, an independent optimization of the grating and the gain region is much easier because there is no need to adjust conditions in the other areas of the semiconductor laser. Such an optimization of the gain region, for example, offers the possibility to achieve low threshold current densities and high output efficiencies by an improved current injection.

On the other hand, a simpler and better control of the spectrum of the laser emission can be achieved by an optimization of the lattice properties without influencing the current injection or the gain of the material. Also the sizes of the particular regions can be chosen without paying attention to the other regions. For example, the interaction region can be chosen to be large in comparison with the gain region. A long interaction region together with the low coupling coefficient results in the interaction of the light with an especially large number of lattice lines, which can be used to achieve a particularly good wavelength selection and in consequence a very large side mode suppression.

Although the implementation of the lattice structure can be arbitrary, for example as a so-called index coupled grating or as a gain coupled grating, it is shown that it is particularly beneficial if the grating structure is a complex coupled grating structure. In such a case the grating structure modulates the real and imaginary parts of the index of refraction. The grating structure therefore periodically modulates the losses and the strength of reflection for the light propagating through the laser. Laser diodes with such a grating structure show a high degree of insensitivity to light radiated back into the laser which allows them to be used without an optical isolator, for example, in applications like optical fiber transmission.

A particularly efficient method to define the geometry of the gain region is to establish an electrical contact between the waveguiding region and the contact metallization. In such a case it is possible that the laser layer extends over the entire base area of the semiconductor laser. Nevertheless it is still feasible to have a gain region and an interaction region without gain. One particular advantage of a laser layer extending over the entire base of the semiconductor laser is the simplicity of the design. It is therefore possible to grow the laser layer on the substrate material using non-patterned epitaxial methods, which is particularly cost-efficient. Pumping of the semiconductor laser when an electrical voltage is applied occurs only in the waveguiding region where an electrical contact is formed to the contact metal. Only in this section is a pumping effect and thus a gain of the light source achieved within the semiconductor laser.

A further simplification of the design is possible if an insulating layer is formed outside of the gain region between the contact metal and adjacent areas of the semiconductor laser. In this case, the metal of the contact doesn't need to be patterned like the waveguide in the region of the gain area. In particular, it is possible to define an explicitly larger contact area which allows the formation of a simplified contact to the laser, for example, using a wire. It is also possible to establish a current injection from the side of the semiconductor laser using a clamp.

If the gain region and interaction region are adjacent to each other it is possible to avoid areas without functionality (neither interaction nor gain) which further improves the device properties of the semiconductor laser. One consequence of the above property is a reduced size of the semiconductor lasers. Furthermore there are fewer damping effects caused by the propagation of the light through areas without functionality which also leads to improved device performance. "Adjacent" could also mean a small distance between the two areas especially to avoid a mutual interference, a proximity effect or for a simplified fabrication of the semiconductor laser.

It is beneficial in some embodiments of the present invention if the lattice structure is arranged in a plane parallel to the laser layer. In such a case the lattice structure is arranged in the direction of the lightwave which is amplified in the gain region. Furthermore a definition or processing of the lattice structure using conventional material processing steps like epitaxy, lithography or etching processes is particularly easy.

It is possible in some embodiments of the present invention that the interaction region is only at one end of the semiconductor substrate. In such a case a particularly easy extraction of the light from only one side of the semiconductor laser is possible.

It is also possible in some embodiments of the present invention that the grating region is established on both ends of semiconductor laser. In this form the device could achieve, for example, a further improvement in side mode suppression. It could also be beneficial in some embodiments of the present invention to apply in at least one interaction region a contact metallization which is in electrical contact with the waveguide region. This design enables an optical gain of the lightwave in the interaction region independent of the gain region. Through this means, a particularly high output power or a tuning of the emitted laser light is possible. Naturally, the different contact metallizations in the interaction regions can have different structures. In addition, in one interaction region more than one independent contact metallization of the interaction region may be applied.

If a metal such as chromium or others is used for the definition of the grating structure, the previously described beneficial aspects will be particularly realizable. Independent of the material used for the definition of the grating structure, the grating structure can also be realized not only by the addition of material but also by material removal. It is also possible that the grating structure is defined by the substrate material itself. In this case the definition of a self-aligned grating is possible. Indium phosphide (InP) substrates have proved particularly beneficial. This material is particularly well suited for the definition of a semiconductor laser according to some embodiments of this invention.

For the realization of a small coupling between lightwave and grating structures, it is advantageous if the grating structure in at least one interaction region is realized by two structures on both sides of the waveguide region adjacent to the waveguide region. According to the size of the elements, a different coupling between lightwave and grating structure can be realized easily. By choosing e.g., a broader ridge waveguide region, a smaller overlap between the lightwave and grating structure can be realized, resulting in a smaller interaction. By the definition of structure regions on both sides, a symmetry is achieved, which is particularly advantageous for the device characteristics.

It is also possible that the grating structure in at least one interaction region is only defined on one side of the waveguide region. The coupling in such a design occurs only on one side of the waveguide region, thereby cutting the resulting coupling substantially in half compared to two structures on both sides of the waveguide region.

In any case, it is advantageous if the patterned regions of the grating structure are defined along the edges of the waveguide region. Through this, fine tuning of the coupling characteristic between laser light and grating structure is simplified. By choosing the cross-section geometry of the grating structure accordingly, the coupling characteristic is adjustable. By "adjacent" a small gap between grating structure and waveguide region is also meant. The coupling characteristic can be adjusted by a variation of the size of this gap.

Regarding an easy fabrication and a maximization of the accuracy achievable by the process, the sides of the waveguide region are preferentially aligned perpendicular to the plane of the grating structure.

The process according to some embodiments of the invention shows the criteria of having the sides of the waveguide arranged substantially at right angles to the plane in which said grating structure extends. According to the process described, based on a semiconductor substrate, the fabrication of a complete semiconductor structure is performed in an epitaxial process followed by the fabrication of a waveguide region and by a material removal process for the definition of supporting areas alongside the waveguide region and followed by the definition of the grating structure on the supporting areas in the interaction regions. In doing so, also only a single supporting layer can be attributed to each semiconductor laser.

If an insulation layer is defined after the definition of the grating structure in the supporting region, and in particular in the interacting region, a protection of the grating structure can be achieved and an electrical current flow (which could result in a gain effect in the interaction region) can be efficiently suppressed.

It is possible that, for the definition of a metal grating structure, a lithography process followed by subsequent metallization of the lithographic structure is used. This process for the definition of the gratings is essentially independent of the material system and can be applied to various semiconductor systems. Also the grating can be realized using different materials, as far as a high enough contrast in refractive index (and/or absorption respectively) exists for the feedback properties. The lithography process can be defined by a photoresist or electron-beam resist using a mask or focused radiation and transferred to a metal layer (e.g., by a lift-off step or an additional etch step).

But it is also possible that, for the definition of the grating structure, an ion implantation process is used. This process can be done either without a mask using a focused ion beam or with a mask using a homogeneous beam. In the indium phosphide (InP) system a gallium ion beam (Ga+) is conveniently employed. In any case, crystal defects are generated in the substrate material by the implantation process.

It is advantageous, if crystal defects are generated by the implantation process, especially crystal defects deep in the substrate material, to at least partially anneal the defects by the application of an annealing step. This annealing step can lead to a selective mixing of the active region, so that the absorption in the band gap region in the implanted region can be reduced, resulting in a modulated gain coupled grating structure. Because so called "channeling" ions can penetrate very deep into the crystal lattice, the annealing step may also prove beneficial for the device performance elsewhere.

In addition, crystal defects, especially highly perturbed crystal defects close to the surface generated by the implantation process, can be removed by a material removal process, advantageously an etch process. The crystal defects close to the surface are generally especially pronounced, so that they can be removed by a selective etch process.

Especially by a combination of an annealing process and a subsequent material removal process, a complex coupled grating can be realized in an easy way, with both gratings (the grating formed by intermixing and the etched grating) being self-aligned. The combination of both processes has been especially well established for indium phosphide (InP), but can in principle be also applied to other material systems.

An option for the fabrication process which is particularly advantageous from an economic point of view is possible if, for the fabrication of a great variety of semiconductor lasers with different characteristics, first the fabrication of a semiconductor wafer is performed by application of an epitaxy structure on a semiconductor substrate, followed by the fabrication of the waveguide regions of the individual laser diodes on wafer scale, which means by the fabrication of a ridge waveguide structure on the surface of the semiconductor laser wafer with parallel waveguide regions and supporting areas in between. Only then follows the partitioning of the semiconductor wafer in individual semiconductor laser chip units, while the exact definition of the properties of the individual laser diode by the definition or implantation of a grating structure with corresponding structural parameters on the surface of a selected number of laser diodes takes place.

It is thus possible for the laser diodes which have been produced on the composite wafer and are already provided with the waveguide ridge to be used as basic laser diodes or "unfinished" laser diodes with defined electrical and optical properties whereupon, from this reservoir of identically formed basic laser diodes, the required number of laser diodes can then be selected and, by the application or implantation of defined lattice structures, the desired number of mono mode laser diodes with precisely defined optical and electrical properties can be produced substantially without rejects.

BRIEF DESCRIPTION OF THE DRAWINGS

In the following the design of one possible model of a semiconductor laser diode according to some embodiments of the present invention and one possible fabrication process will be explained according to the figures.

The drawings herein are not to scale and the depictions of relative sizes and scales of components within a drawing and between drawings are schematic and also not to scale.

To facilitate understanding, identical reference numerals have been used, where possible, to designate identical elements that are common to the drawings.

FIG. 1a-e depict different stages in the fabrication of one possible embodiment of a DBR-laser diode with weak coupling between lightwave and grating structure.

Figure 2:
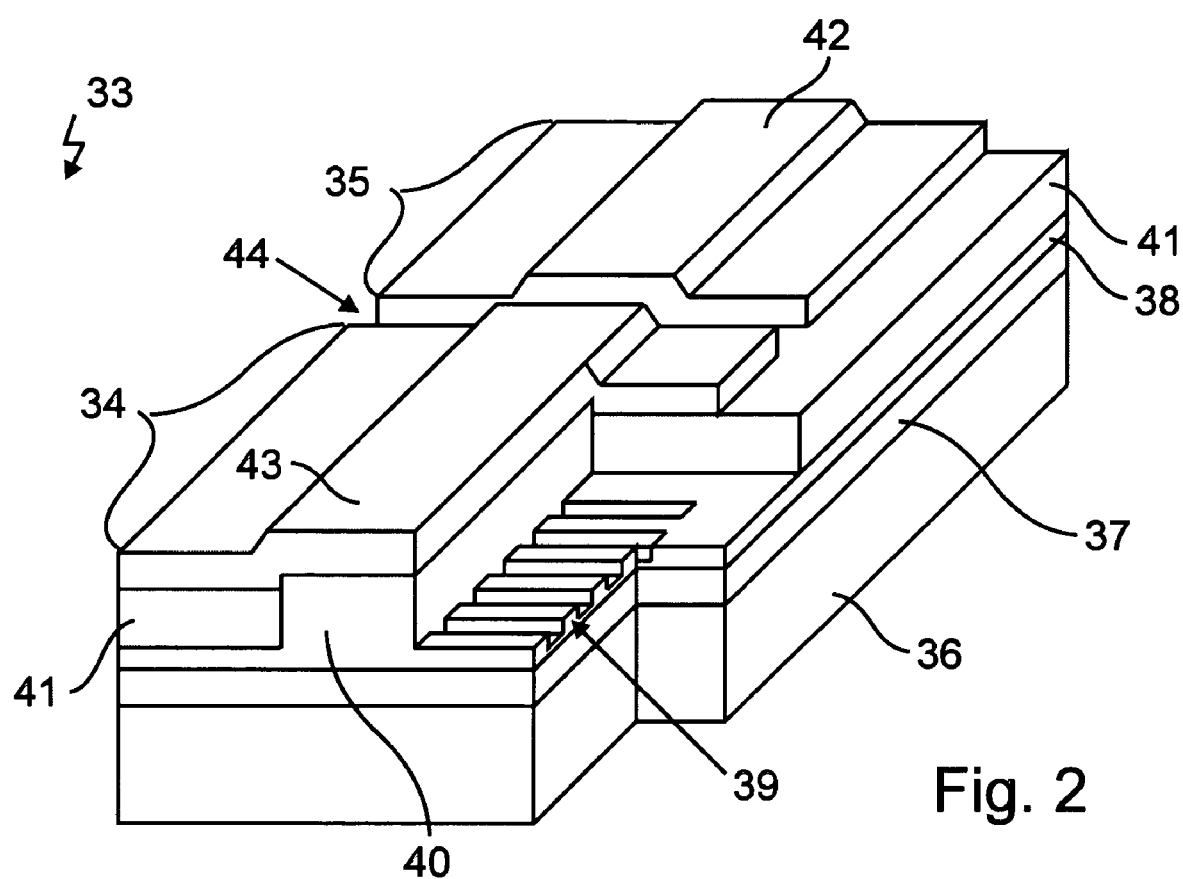
Figure 3A:
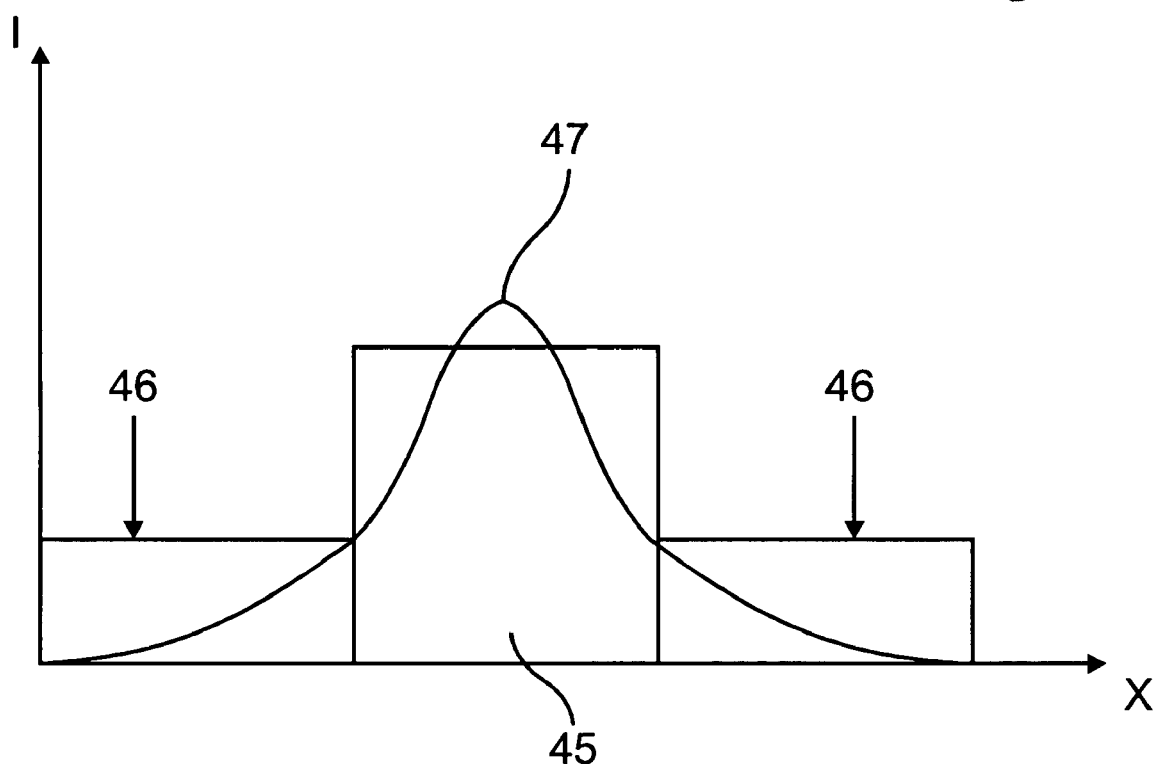

FIG. 2 depicts a second possible embodiment of a DBR-laser diode with weak coupling between lightwave and grating structure in schematic view;

FIGS. 3a and b depict the intensity distribution of the lightwave in the interaction region of a laser diode for two different coupling coefficients between lightwave and grating structure.

DETAILED DESCRIPTION OF THE INVENTION

Figure 1A:
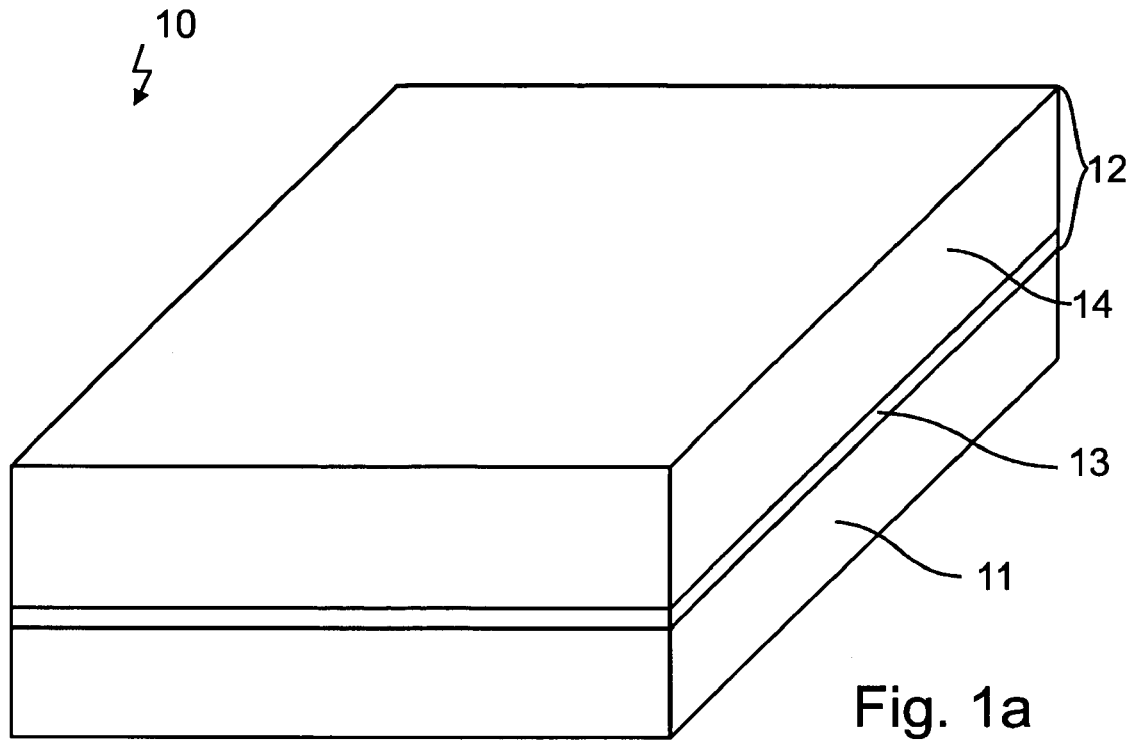
Figure 1B:
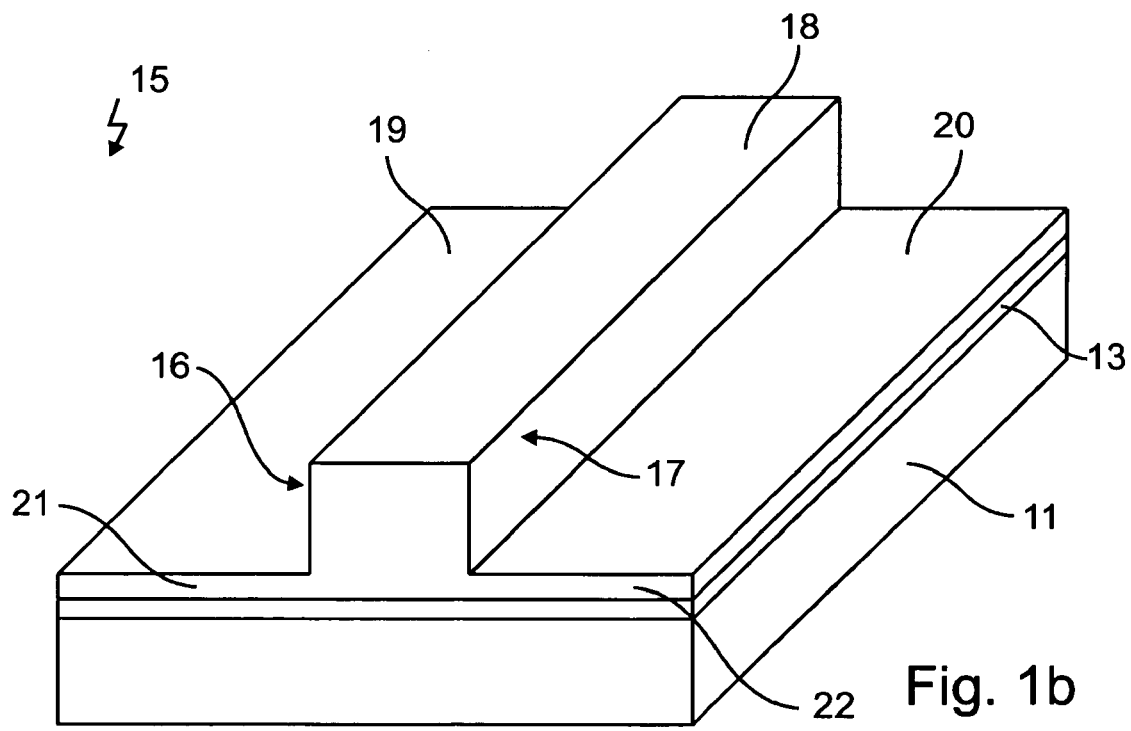
Figure 1C:
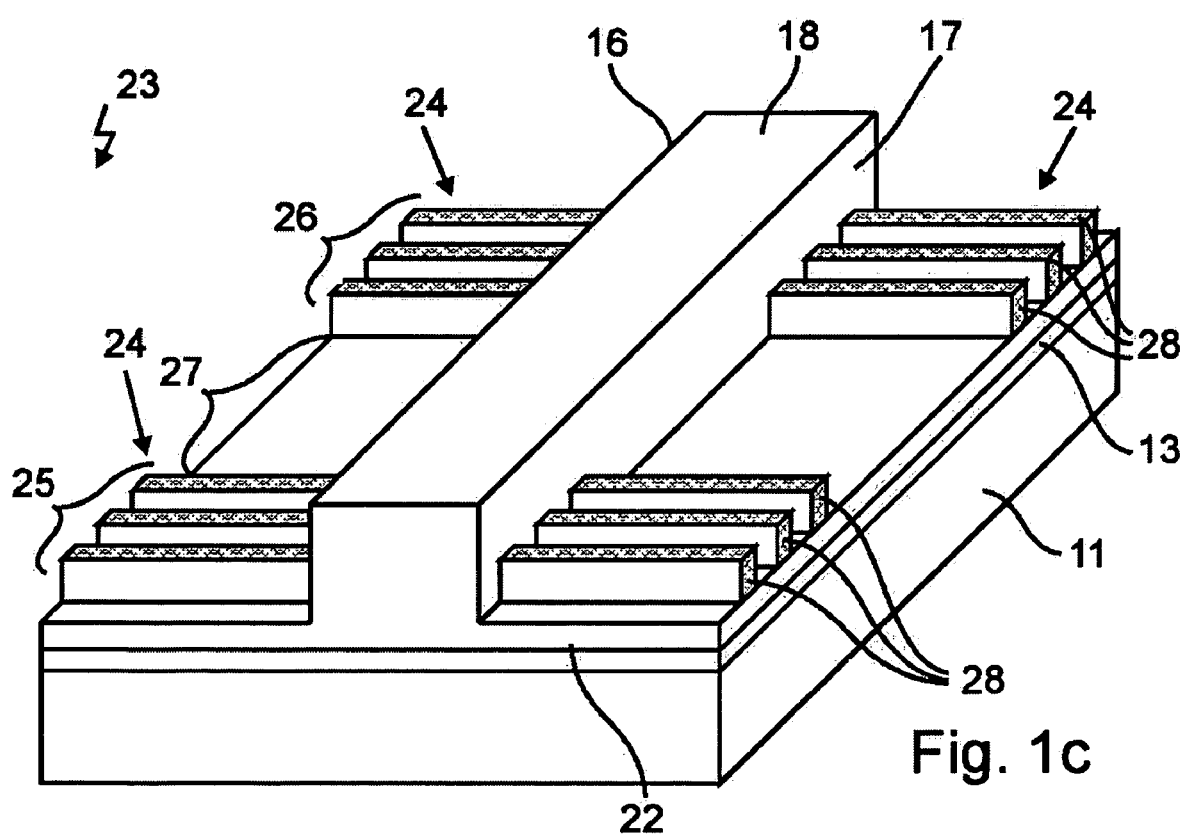
Figure 1D:
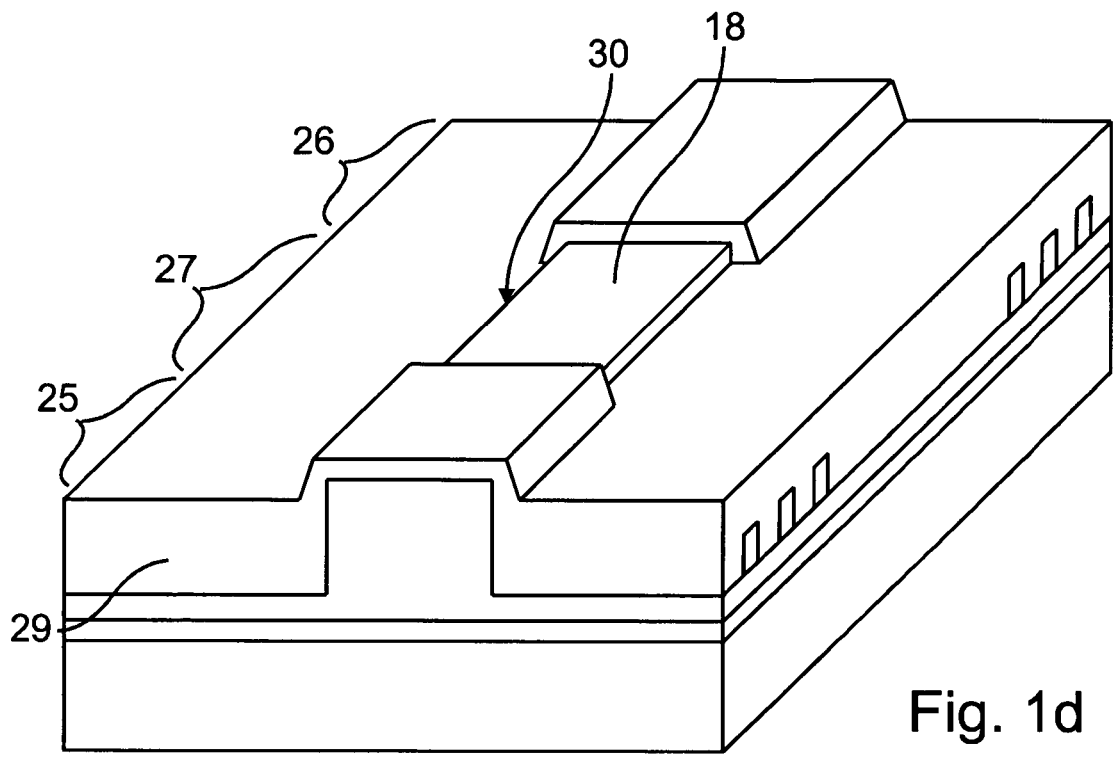
Figure 1E:
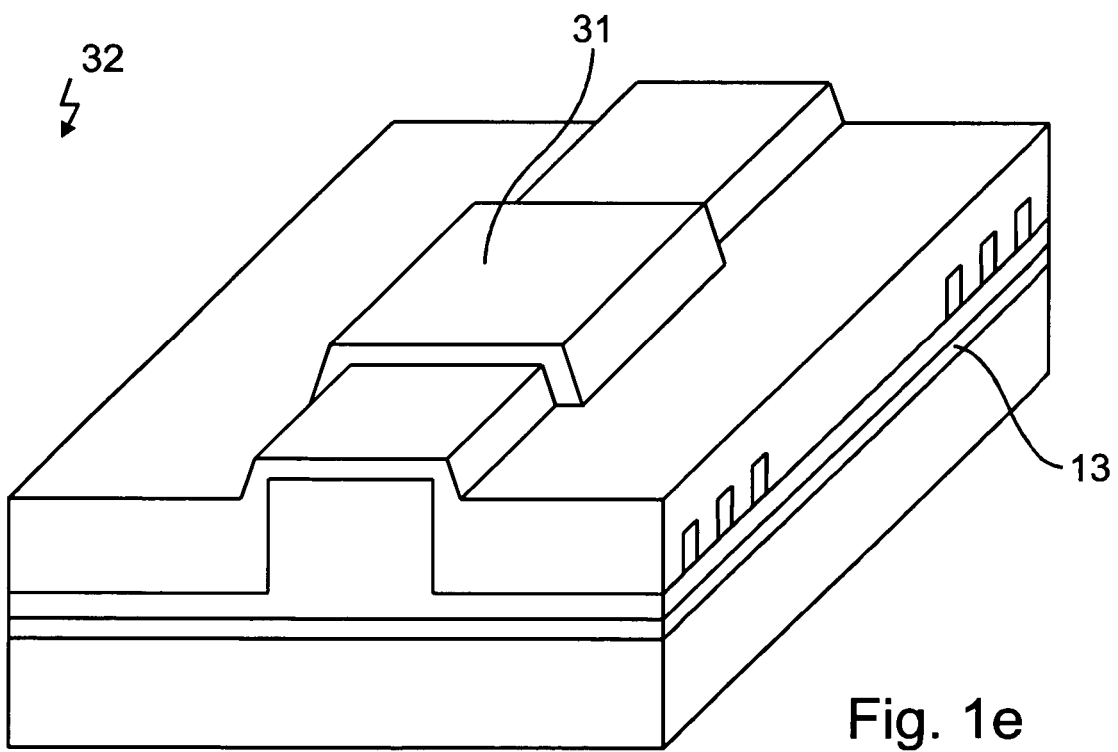

FIG. 1a shows in perspective schematic view a base laser diode 10, which serves as basis for the fabrication of a semiconductor laser (FIG. 1e). The base laser diode 10 consists in some embodiments of a substrate 11, consisting in this case of indium phosphide (InP). However other semiconductor materials are possible. On the substrate 11 an epitaxial structure 12 was deposited by known processes. The epitaxial structure 12 essentially consists of an optically active laser layer 13 and a cap layer 14, which in this case consists of the same material as the substrate 11 (indium phosphide).

Based on the base laser diode 10, first the transition model (intermediate structure) of a waveguide diode or laser diode 15, shown in FIG. 1b, is fabricated. For this, certain regions of the cap layer 14 (shown in FIG. 1a) are partially removed by a material removal process. The material removal process selectively acts in the region of the side areas 19 and 20. In the middle of the waveguide diode 15 a waveguide region remains, which in this embodiment is formed as a ridge waveguide (or waveguide ridge) 18. The side edges 16 and 17 join the corresponding side areas 19 and 20 of the waveguide diode 15 essentially at a right angle. As can be seen clearly in FIG. 1b, the material removal process is controlled in such a way that the cap layer 14 (FIG. 1a) is thinned down but not completely removed. In other words the waveguide ridge 18 and also the laser layers 21 and 22 between the side areas 19 and 20 and the laser layer 13 consist of the same material, which in this case is indium phosphide.

The material removal process can be chosen arbitrarily. For example known processes (e.g., dry etch processes, wet etch processes and so on) can be used.

The definition of grating structures on the side areas 19 and 20 creates a DBR-raw laser diode 23 as another transition form (that is, intermediate structure). As shown in FIG. 1c, on both sides of the waveguide ridge 18 in a first interaction region (or first grating section) 25 as well as in a second interaction region (or second grating section) 26 strip shaped gratings or grating structures 24 are defined. In this simplified example each grating structure 24 consists of three grating lines 28. The number was chosen to provide an illustrative view of the geometry, and grating structures used in actual devices typically consist of several hundreds or thousands of grating lines. The grating lines 28 in the grating structure are typically arranged equally spaced and are oriented in a way that they are aligned with each other respectively on both sides of the waveguide ridge 18. Both interaction regions (or grating sections) 25 and 26 are located at both ends of the DBR raw-laser diode 23 with the lengthwise orientation defined by the waveguide ridge 18. A gain region (or gain section) 27 extends between both interaction regions (or grating sections) 25 and 26, in which in the final DBR-laser diode 32 the amplification of the laser light takes place and in which no grating structures are defined. That is, one or more regions or sections of the waveguide ridge exist in which no grating structures appear adjacent to the waveguide ridge, with or without a gap or separation between a grating structure and the side edge of the waveguide ridge. For economy of language, such regions are referred to as "gratingless" regions or sections.

In this particular example, the grating structures 24 are formed as metal grating structures. This can be realized by the deposition of a metal, e.g., chromium, on the side areas 19 and 20 of the waveguide laser diode 15 (FIG. 1b). Afterwards the grating structure is defined in the deposited metal layer by photoresist or electronresist and a subsequent exposure with light or accelerated electrons. Afterwards the layers to be removed are removed by a material removal process e.g., an etch process. It is also possible to define the metal grating structure by first exposing a resist layer followed by a deposition of a metal layer. The resist layer is then removed, together with the metal deposited on the resist, whereas the metal deposited on the side areas 19 and 20 in the exposed regions of the resist forms the grating structure.

An additional possibility not shown in this particular example is to use a focused ion beam which defines the grating structures directly in the laser layers 21 and 22 (FIG. 1b). In this case, no resist layer is required. Naturally, an unfocused ion beam combined with a mask can also be used. In any case, defects in the crystal lattice are generated in the regions implanted with ions in the laser layers 21 and 22. In a subsequent thermal annealing step, this leads to a selective mixing of the active region. In addition the highly perturbed regions near the surface can be removed by a selective etch process. In this way a complex coupled grating structure is formed, while both parts of the grating structure (which means the grating formed by intermixing and the etched grating) are self-aligned to each other.

In the indium phosphide system under consideration, Ga+ ions for implantation with 100 keV are well established. An annealing step, during which the temperature of the semiconductor was raised to 750° C. for a time of 60s, was applied. The etch process can be done by a 10 minute bath in 10% HF solution at 80° C.

Independent from the material deposition or removal process, the structure shown in FIG. 1c or a similar structure of a DBR-raw laser diode 23 results as a transition form.

In an additional process step, the surface of the DBR-raw laser diode 23 is then covered by an insulating layer 29 (see FIG. 1d). In the two interaction regions (or grating sections) 25 and 26, the insulating layer 29 covers the corresponding side areas (FIG. 1b), the grating structure defined on these areas as well as the waveguide ridge 18 (FIG. 1b). In the gain region 27, the insulating layer covers only the side areas 19 and 20. The waveguide ridge 18 is not covered by an insulating layer in this region, and can therefore be accessed from the outside via the opening 30. As a final step, a contact metallization 31 is formed over the opening 30 in the insulating layer 29. The final DBR laser diode 32 (FIG. 1e) can now be connected to a current source with a wire, which is not shown in the figure. Any further contacts, especially contacts to the laser layer 13, are not shown in this simplified view for the sake of clarity.

In FIG. 2 a second possible design for a weakly coupled laser diode is shown. To illustrate the design of the laser diode, some simplifications are made in the figure which are of course not present in the real device. The laser diode is designed as an asymmetric DBR-laser diode 33. It only contains one interaction region 34 on one side of the diode. The other end of the asymmetric laser diode 33 serves as gain region 35. The growth is done on a substrate 36. On this substrate a laser layer 37 is formed which covers the whole area of the asymmetric DBR-laser diode 33. On the laser layer 37 an etched semiconductor surface 38 is deposited which consists of the same material as the substrate 36. The grating structures 39 in the interaction region are designed as a complex coupled grating and were produced by the ion implantation process with subsequent annealing and material removing step as described above. A corresponding grating structure 39 is also present on the other side of the ridge wave guide 40, but cannot be seen due to the angle of the view chosen for this drawing. On both side areas adjacent to the ridge waveguide 40 an insulating layer 41 is deposited along the entire length of the asymmetric DBR-laser diode 33, which only leaves the ridge waveguide 40 uncovered. On the surface of the asymmetric DBR-laser diode 33 two contact pads 42, 43 are attached, which are separated from each other by a slit shaped gap 44. By injecting a current through the first contact pad 42, the gain region 35 is pumped, resulting in light amplification. The interaction region 34 provides a wavelength selection of the light which depends on the mutual distance of the corresponding grating lines within the grating structures 39. Both contact pads 42, 43 are electrically connected to the corresponding region of the ridge waveguide 40. On the laser layer 37 an etched semiconductor surface is deposited which consists of the same material as the substrate 36. The grating structures 39 in the interaction region are designed as a complex coupled grating and were produced by the ion implantation process with subsequent annealing and material removing step as described above. A corresponding grating structure 39 is also present on the other side of the ridge wave guide 40, but cannot be seen due to the angle of the view chosen for this drawing. On both side areas adjacent to the ridge waveguie 40 an insulating layer 41 is deposited along the entire length of the asymmetric DBR-laser diode 33, which only leaves the ridge waveguide 40 uncovered. On the surface of the asymmetric DBR-laser diode 33 two contact pads 42, 43 are attached, which are separated from each other by a slit shaped gap 44. By injecting a current through the first contact pad 42, the gain region 35 is pumped, resulting in light amplification. The interaction region 34 provides a wavelength selection of the light which depends on the mutual distance of the corresponding grating lines within the grating structures 39. Both contact pads 42, 43 are electrically connected to the corresponding region of the ridge waveguide 40.

In addition to, but independent of, the normal operation mode, in which an electrical voltage is applied to the first contact pad 42, also the second contact pad or metallization 43 of the depicted asymmetric DBR-laser diode 33 can be biased with an electrical voltage. This leads to an amplification of the light wave in the interaction region 34 in addition to the amplification in the gain region 35. Normally, this implies a slightly lower side mode suppression ratio. On the other hand, however, a higher light output power can be generated. Therefore, the asymmetric DBR-laser diode 33 can be used flexibly for different purposes.

In the case of a semiconductor laser with two interaction regions on opposite ends of the laser diode, single or multiple contact pads, situated in the interaction region, signals can be applied to both interaction regions thus making them addressable independently. This implies a variety of possibilities for addressing the laser diode, and therefore multiple possibilities to alter the emission characteristics of the laser diode.

As an example, FIG. 3 shows a matching of the coupling between the light wave 47, 47a and the grating structure 46, 46a by means of differently sized grating structures 46, 46a and ridge waveguides 45, 45a. FIG. 3a shows a situation where a major portion of the light wave power 47 falls within the ridge waveguide 45. The overlap of the light wave with the grating structures 46 however is only small, and hence only negligible coupling between light wave and grating structures is present. Therefore the interaction between the light wave and the grating structure 46 occurs over a larger number of grating lines, so that the frequency selection may be drastically improved as compared to conventional laser diodes. Of course, this requires a sufficient number of grating lines on the laser diode. Also one may conceive, that a narrow gap is formed between the ridge wave guide 45 and the grating structure 46 corresponding to a small coupling between the light wave and the grating structure 46. Furthermore, it is evident, that a grating structure 46, which is applied to only one side of the ridge wave guide 45 would lead to an even more reduced coupling between the lightwave 47 and the grating structure 46.

Figure 3B:
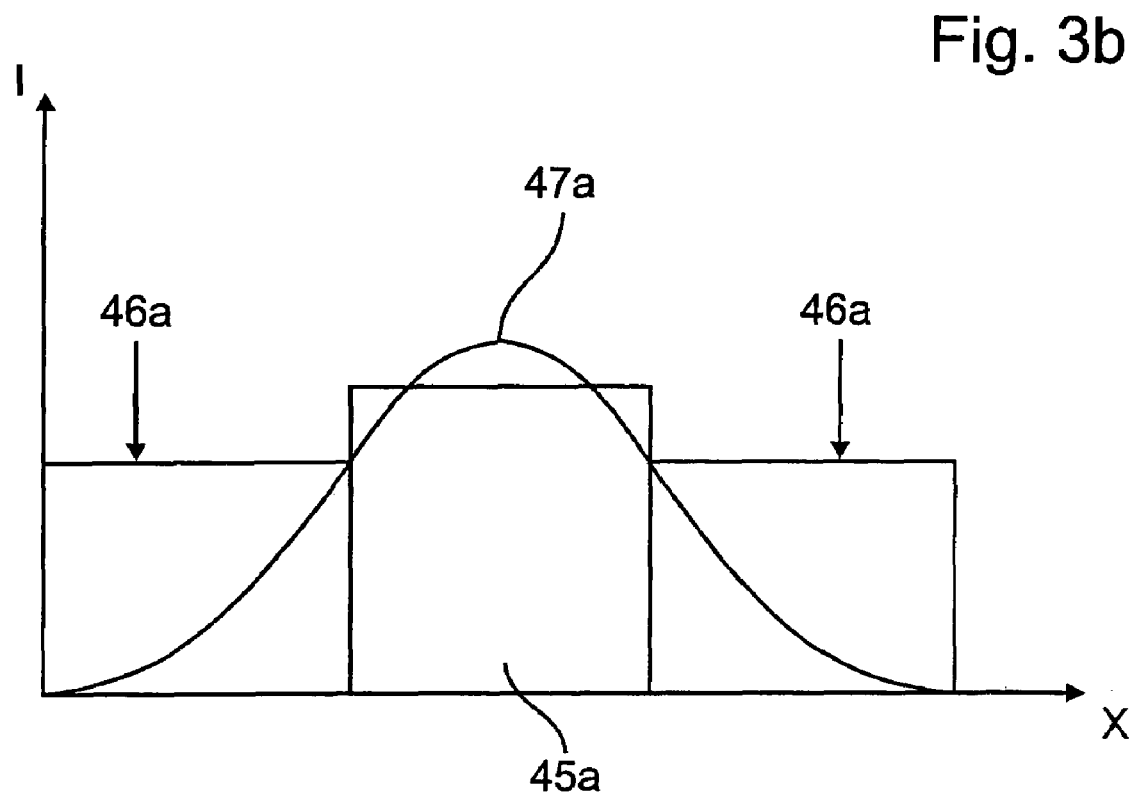

As a comparison, FIG. 3b depicts the case of a strong coupling between the light wave 47a and the grating structure 46a. Here, a large overlap between the lightwave 47a and the grating structure 46a exists, such that a correspondingly strong coupling results between the lightwave 47a and the grating structures 46a.

Although various embodiments which incorporate the teachings of the present invention have been shown and described in detail herein, those skilled in the art can readily devise many other varied embodiments that still incorporate these teachings.

What is claimed is:

1. A process for fabricating a semiconductor laser diode comprising:
    forming an epitaxial structure on a semiconductor substrate by an epitaxial process wherein said epitaxial structure includes an active laser layer on said semiconductor substrate and a cap layer on said active laser layer;
    forming a waveguide ridge and side areas adjacent to said waveguide ridge by removing material from said cap layer;
    forming a plurality of strip shaped grating structures in or on said side areas wherein said strip shaped grating structures include stripes of varying refractive index; and wherein said strip shaped grating structures are located so that the coupling coefficient between light guided in said waveguide ridge and said strip shaped grating structures is less than approximately 30 cm$^{-1}$; and wherein said strip shaped grating structures are located so that one or more gratingless sections exist;
    forming at least one current drive electrode located so as to permit independent pumping of sections of said laser diode; and
    further comprising forming an insulating layer following said step of forming a plurality of strip shaped grating structures in or on said side areas.

2. A process as in claim 1 wherein said step of forming a plurality of strip shaped grating structures in or on said side areas is ion implantation.

3. A process as in claim 2 wherein thermal annealing is performed following said ion implantation so as to anneal at least some defects created by said ion implantation.

4. A process as in claim 2 further comprising performing a material removal process following said ion implantation so as to remove at least some defects created by said ion implantation.

* * * * *